United States Patent [19]

Wakino

[11] Patent Number: 4,507,630

[45] Date of Patent: Mar. 26, 1985

[54] NOISE FILTER FOR CONNECTORS

[75] Inventor: Kikuo Wakino, Muko, Japan

[73] Assignee: Murata Manufacturing Co., Ltd., Japan

[21] Appl. No.: 458,752

[22] Filed: Jan. 17, 1983

[30] Foreign Application Priority Data

Jan. 18, 1982 [JP] Japan .............................. 57-5391[U]

[51] Int. Cl.³ .................... H03H 7/00; H03H 7/01; H01R 13/66; H01G 4/38
[52] U.S. Cl. .................................. 333/182; 333/184; 333/185; 361/303; 361/329; 339/147 R
[58] Field of Search .................... 333/167, 181–185; 339/147 R, 147 C, 143 R; 361/301, 302, 303, 306, 328–330

[56] References Cited

U.S. PATENT DOCUMENTS

| | | | |
|---|---|---|---|
| Re. 29,258 | 6/1977 | Fritz | 333/182 |
| 3,002,162 | 9/1961 | Garstang | 333/183 |
| 3,939,444 | 2/1976 | Hollyday et al. | 333/182 |
| 4,126,370 | 11/1978 | Nijman | 333/182 X |

Primary Examiner—Marvin L. Nussbaum
Attorney, Agent, or Firm—Ostrolenk, Faber, Gerb & Soffen

[57] ABSTRACT

A noise filter (17) comprising a plurality of cylindrical capacitors (12) having a throughgoing hole (13) for receiving a connection pin (20) of a connector (18). The inner peripheral surface of each cylindrical capacitor (12) is formed with an inner electrode (14) for electric connection to the connection pin. The outer peripheral surface of the cylindrical capacitor (12) is formed with an outer electrode (15). The plurality of cylindrical capacitors (12) are bunched with their outer peripheral surfaces contacting with each other, their outer electrodes being electrically connected together.

23 Claims, 17 Drawing Figures

NOISE FILTER FOR CONNECTORS

BACKGROUND OF THE INVENTION

1. Field of the Invention

This invention relates to a noise filter for connectors and paticularly to a noise filter using capacitors.

2. Description of the Prior Art

FIG. 1 is a longitudinal section showing part of a connector having a conventional noise filter incorporated therein. The connector 1 has a grounded metal case 2. Installed in the case 2 is a base plate 3 of an insulating nature, from which a plurality of pins 4 project. The pins 4 are received by a mating connector (not shown) which is to be connected to the connector 1 and thereby establishes an electric connection.

Usually, in such connection, noise is produced. To eliminate such noise, a noise filter is built in the connector 1. For example, the noise filter is constituted of a cylindrical capacitor 5. The cylindrical capacitor 5 is in the form of a hollow cylindrical body having a throughgoing hole through which the pin 4 extends. The inner peripheral surface defining the throughgoing hole has an inner electrode formed thereon, which electrode will be electrically connected to the pin 4. The outer peripheral surface of the cylindrical capacitor 5 has an outer electrode formed thereon, which electrode will be electrically connected to the metal case 2. Insulating resin 6 is formed to cover the cylindrical capacitors 5 except the front end portions of the pins 4.

With the connector 1 thus arranged, noise from the outside is eliminated by the cylindrical capacitors 5. If, however, a noise filter of this type is employed additional steps are, there is a required to establish an electric connection between each pin 4 and each cylindrical capacitor 5: As a result, the prior art connector exhibits the drawback of requiring significant time and labor in producing such connectors 1.

FIG. 2 is a perspective view showing the external appearance of another conventional noise filter used in a connector. FIG. 3 shows the lower surface of the noise filter shown in FIG. 2. An insulating base plate 8 through which a plurality of pins 7 extend is formed of a dielectric material. One surface of the insulating base plate 8 is formed with electrodes 9, e.g., four in number, separated from each other, while the other surface is formed with a single electrode 10 throughout. The first electrodes 9 will later be electrically connected respectively to the pins 7. There is an insulating gap 11 formed between the other electrode 10 and each pin 7. When this noise filter is built in a connector, the electrode 10 is grounded.

The noise filter shown in FIGS. 2 and 3 encounters a problem of stray capacity. For example, such stray capacity presents itself between divisional electrodes 9, causing interference and making satisfactory elimination of noise impossible. Further, the formation pattern of the electrodes 9 must be selected in accordance with the disposition of the pins 7 used in the connector, thus limiting flexibility in designing such noise filters, and making the production difficult.

SUMMARY OF THE INVENTION

Accordingly, an object of the invention is to provide a noise filter which prevents occurrence of stray capacity and hence eliminates interference and is capable of satisfactorily eliminating noise from the outside.

Another object of this invention is to provide a noise filter of simplified arrangement wherein electric connection and mechanical fixing which must be made in constructing the noise filter in a connector are facilitated.

A further object of this invention is to provide a noise filter which is so constructed as to be applicable to different types of connectors by making simple adjustments.

Briefly, this invention is directly towards a noise filter constituted of plurality of bunched cylindrical capacitors. Each cylindrical capacitor has an inner peripheral surface defining a throughgoing hole for receiving a connection pin provided on a connector, and an outer peripheral surface opposed to said inner peripheral surface. The inner peripheral surface is formed with an inner electrode and the outer peripheral surface with an outer electrode. The cylindrical capacitors are bunched and, in this condition, are mechanically fixed in such a manner that each cylindrical capacitor has its outer peripheral surface in contact with those of adjacent cylindrical capacitors, the outer electrodes being electrically connected to each other. And the connection pins are electrically connected to the inner electrodes.

In a preferred embodiment, the cylindrical capacitors are of the same shape and size. When these cylindrical capacitors are bunched, they are so arranged that one cylindrical capacitor is surrounded by, e.g., six cylindrical capacitors. Any cylindrical capacitor that, depending upon the number and/or position of necessary connection pins, happens to be positioned where there is no connection pin to pass therethrough, may be replaced by a mere spacer which is not a capacitor.

Further, according to this invention, there are provided different types of means for mechanically fixing a plurality of bunched cylindrical capacitors and electrically connecting their outer electrodes to each other. Among such means are soldering the outer electrodes of the cylindrical capacitors to each other, using an electrically conductive adhesiv agent instead of soldering, and encircling the bunch of cylindrical capacitors by a hoop-like member. The hoop-like member may be in the form of a metal ring or belt, or part of the case of the connector may be arranged to serve as a hoop-like member.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
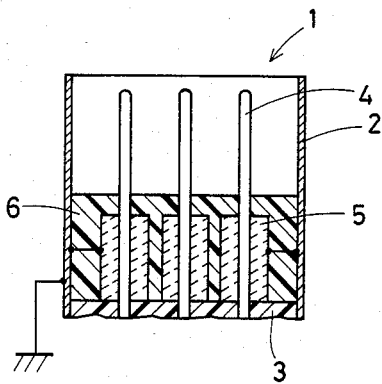
FIG. 1 is a longitudinal section showing part of a connector having a conventional noise filter incorporated therein.
Figure 2:
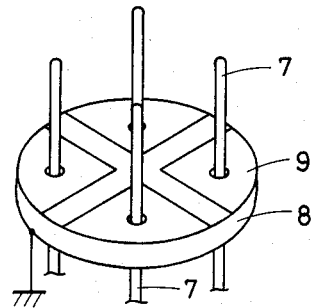
FIG. 2 is a perspective view showing the external appearance of another conventional noise filter used in a connector.
Figure 4:
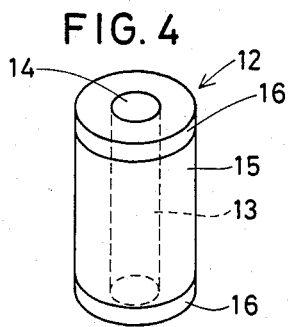
FIG. 4 is a perspective view showing the external appearance of a cylindrical capacitor used in an embodiment of this invention.
Figure 3:
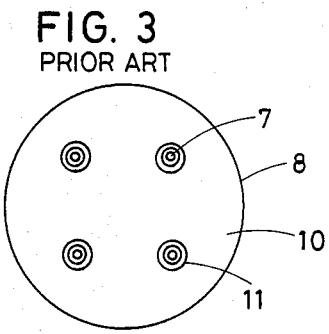
FIG. 3 is a view showing the lower surface of the noise filter of FIG. 2.

Referring to FIG. 4, a cylindrical capacitor 12 used in an embodiment of this invention is shown. The cylindrical capacitor 12 has a throughgoing hole 13 extending along its center axis. The inner peripheral surface defining this throughgoing hole 13 is formed with an inner electrode 14. The outer peripheral surface of the cylindrical capacitor 12 is formed with an outer electrode 15. This outer electrode 15 is formed not throughout the outer peripheral surface of the cylindrical capacitor but as a circumferentially extending band leaving insulating gaps 16 between it and each end surface of the cylindrical capacitor 12. This is for the purpose of providing increased dielectric breakdown strength between the outer electrode 15 and the inner electrode 14. If such a high breakdown strength is not desired, the outer electrode 15 may be formed throughout the outer peripheral surface of the cylindrical capacitor 12. The outer and inner electrodes 14 and 15 may be formed by various methods, e.g., by plating with the metal which forms each electrode or by applying a paste containing powder of such metal and baking said paste.

Figure 5:
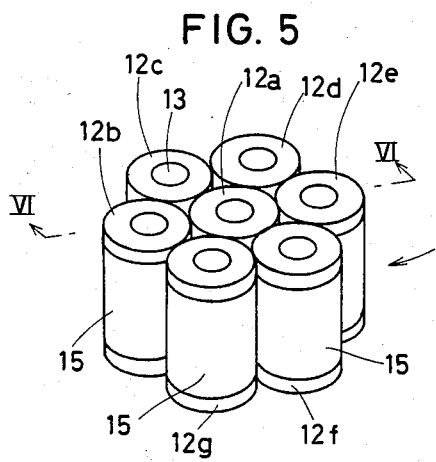
FIG. 5 is a perspective view showing the external appearance of a noise filter constituted of cylindrical capacitors shown in FIG. 4.

A plurality of cylindrical capacitors 12 shown in FIG. 4 are prepared and bunched as shown in FIG. 5. In the example shown in FIG. 5, seven cylindrical capacitors 12a–12g of the same shape and size are bunched. More particularly, one cylindrical capacitor 12a is surrounded by six cylindrical capacitors 12b–12g. In this condition, each of the cylindrical capacitors 12a ∝ 12g has its outer peripheral surface in contact with those of adjacent cylindrical capacitors. And the outer electrodes 15 of the cylindrical capacitors 12a–12g are in contact with each other. In this invention, the in contact condition of the cylindrical capacitors 2a–12g bunched in the manner shown in FIG. 5 is retained. To this end, the outer electrodes 15 of the cylindrical capacitors 12a–12g are soldered together or are bonded together by an electrically conductive adhesive agent. When such retention has been achieved, the cylindrical capacitors 12a–12g are in mechanically integrated condition with their outer electrodes 15 electrically connected together.

Figure 6:
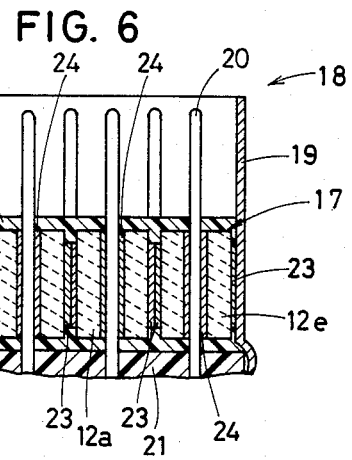
FIG. 6 is a longitudinal section showing part of a connector having the noise filter of FIG. 5 incorporated therein, the view being taken along the line VI—VI of FIG. 5.
Figure 7:
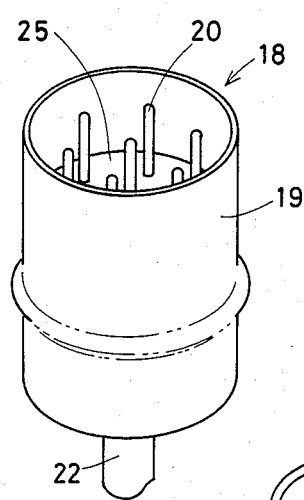
FIG. 7 is a perspective view showing the external appearance of the connector of FIG. 6.

Referring to FIGS. 6 and 7, a connector 18 is shown which has the noise filter 17 of FIG. 5 incorporated therein. The illustrated connector 18 is in the simplest form and may have other component elements added thereto before it is completed as a product. The connector 18 includes a metal case 19 having a substantially cylindrical shape and seven connection pins 20. The connection pins 20 are disposed such that one connection pin is surrounded by the remaining six connection pins. The positions of the connection pins 20 are associated with the positions of the throughgoing holes 13 of the cylindrical capacitors 12a–12g, respectively. In other words, the size and disposition of the cylindrical capacitors 12a–12g are determined in accordance with the desired positions of the connection pins 20.

In assembling the connector 18, for example, the following method is employed. First, electric connection (not shown) is made between the seven connection pins 20 held by a base plate 21 and a cable 22 (FIG. 7), and in this condition, the base plate 21 together with the pins 20 is received in the case 19. Next, the noise filter 17 is received in the case 19 so that the connection pins 20 may pass through the throughgoing holes 13 of the cylindrical capacitors 12. And electric connection between the inner electrodes 14 of the cylindrical capacitors 12 and the pins 20 is effected as by soldering or an electrically conductive adhesive. The inner surface of the case 19 can be intimately contacted with the outer electrodes 15 of the surrounding cylindrical capacitors 12b–12g, if the inner diameter of the case 19 is suitably selected, there being no special means required to ensure electric conduction. Preferably, however, soldering or the like is applied between the outer electrodes 15 and the inner surface of the case 19 so as to establish reliable electric connection therebetween. In addition, the reference numeral 23 in FIG. 6 denotes layers including the outer electrodes 15 of the cylindrical capacitor 12 and the aforesaid electrically conductive material, such as solder or the like. Further, the reference numeral 24 denotes layers including the inner electrode 14 of the cylindrical capacitor 12 and the solder or the like. Further, electric connection between the connection pins 20 and the inner electrodes 14 can be established by pressing the connection pins 20 into the throughgoing holes 13 rather than by using a binder, such as solder, provided that the outer diameter of the connection pins 20 is properly mated with the inner diameter of the throughgoing holes 13. In that case, the layers 24 would represent the inner electrodes 14 themselves. In addition, it is to be pointed out that the layers 23 and 24 are shown thicker than what they should actually be, for the sake of clarity.

Figure 6A:
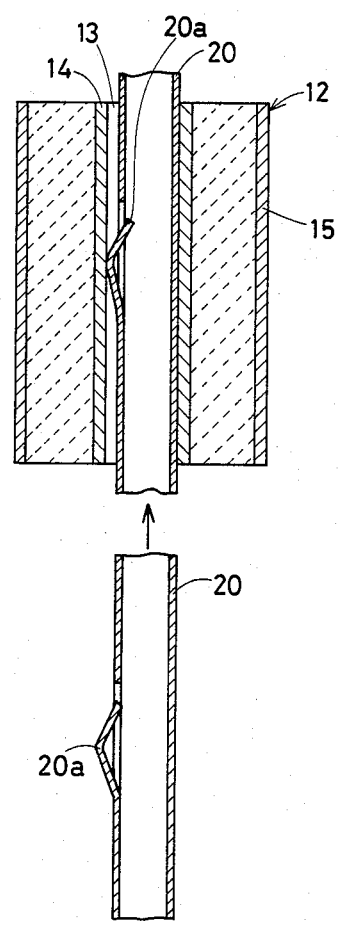
FIG. 6A is a view showing another example of electric connection between the inner electrode of a cylindrical capacitor and a connection pin.

For the electric connection between the connection pins 20 and the inner electrodes 14, the manner shown in FIG. 6A is also usable. Thus, the connection pin 20 is hollow and has a pair of slits formed in a portion of its lateral wall. The portion intervening the slits is outwardly bent to form a spring strip 20a. When the connection pin 20 is passed through the throughgoing hole 13, the spring strip 20a makes firm contact with the inner electrode 14 to establish desired electric connection. Preferably, the connection pin 20 is made of a material which will give the spring strip 20a the required springiness.

After the electric connection has thus been made, insulating resin 25 is poured into the case 19 to cover the noise filter 17.

The order of assembling the connector 18 described above is only exemplary. For example, the cylindrical capacitors 12 may be put in the case 19 one by one. Of course, the seven cylindrical capacitors 12 may be divided into groups and put in the case 19 group by group. In these instances, soldering between the outer electrodes 15 will be performed within the case 19. When such a process is employed, the inner surface of the case 19 advantageously serves as a means for positioning the cylindrical capacitors 12 or groups thereof.

Other embodiments of this invention will be described below.

Figure 8:
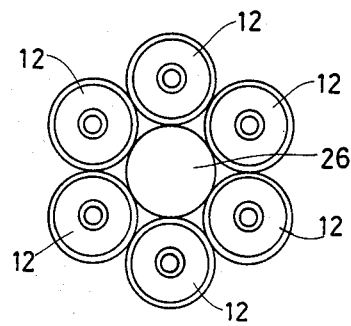
FIG. 8 is a view of another embodiment of this invention, wherein one of the cylindrical capacitor is replaced by a spacer.

Referring to FIG. 8, there is shown a noise filter comprising six cylindrical capacitors 12 and a spacer 26 having the same shape and size as said cylindrical capacitors 12. This embodiment is intended for a noise filter for use with a connector similar to the connector 18 of FIG. 7 but lacking the central one of the connection pins 20. The spacer 26 is made, e.g., of insulating material. The outer surface of the spacer 26 may be formed with an electrode. Further, the spacer 26 may be of hollow cylindrical form. Of course, the spacer 26 may be a cylindrical capacitor 12, the use of which with no connection pin 20 passing therethrough causes no problem. In addition, the position of such a spacer 26 where it is disposed is not limited to the center as shown in FIG. 8; it may be the position of any one of the circumferentially arranged cylindrical capacitors 12. Further, two or more spacers may be used. These forms of disposition of spacers will be suitably changed in accordance with the number of connection pins and their positions on the connector.

Figure 9:
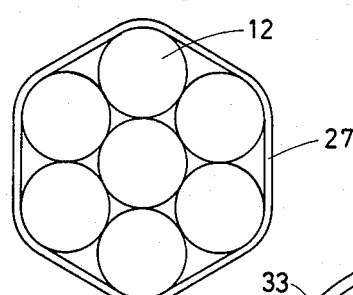
FIG. 9 is a view of a further embodiment of this invention, showing alternative means for mechanically fixing a bunch of cylindrical capacitors.

Referring to FIG. 9, there is shown a belt 27 serving as a hoop-like member surrounding a bunch of cylindrical capacitors 12 shown schematically. The cylindrical capacitors 12 are mechanically fixed by this belt 27 in such a manner that each cylindrical capacitor has its outer peripheral surface in contact with those of adjacent cylindrical capacitors, the outer electrodes thereof being electrically connected to each other. In addition, if the belt 27 is made of electrically conductive material, such as metal, then electric connection can be established when the outer peripheral surface of the belt 27 contacts directly or indirectly with the case 19 (FIG. 6).

Figure 10:
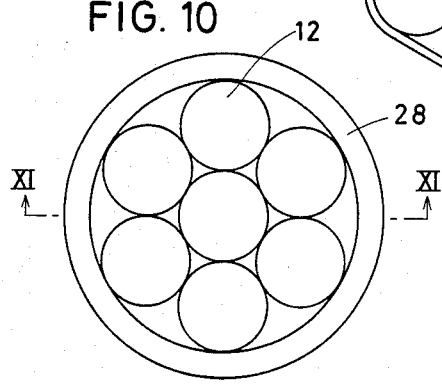
FIG. 10 is a view of a further embodiment of this invention, showing a bunch of cylindrical capacitors retained by a metal ring.
Figure 11:
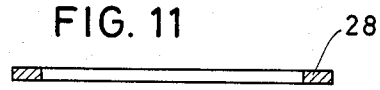
FIG. 11 is a sectional view of the metal ring taken along the line XI—XI of FIG. 10.

Referring to FIGS. 10 and 11, there is shown an embodiment using a metal ring 28 in place of the belt 27 of FIG. 9.

Figure 12:
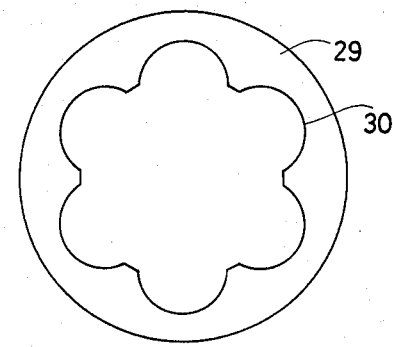
FIG. 12 shows a modification of the metal ring shown in FIGS. 10 and 11.

Referring to FIG. 12, a metal ring 29 is shown. This metal ring 29 is characterized by its inner peripheral shape, the inner peripheral end edge 30 being so selected as to closely fit the contour of a bunch of cylindrical capacitors 12, such as those shown in FIG. 10. With this metal ring 29, the positioning of the cylindrical capacitors 12 can be positively effected.

Figure 13:
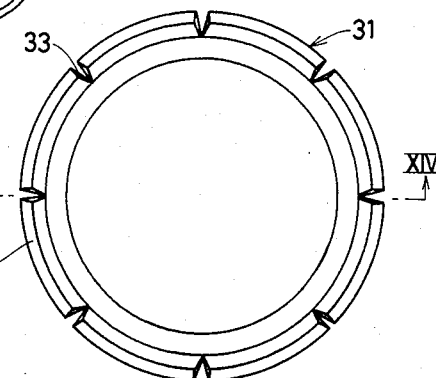
FIG. 13 shows another modification of the metal ring.
Figure 14:
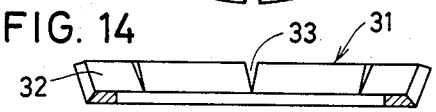
FIG. 14 is a sectional view taken along the line XIV—XIV of FIG. 13.

Referring to FIGS. 13 and 14, a metal ring 31 is shown as a further modification. This metal ring 31 is provided around its periphery with an obliquely upwardly extending wall 32. The purpose of the wall 32 is to ensure that when inserted in the case 19 (FIG. 6), the metal ring 31 contacts the inner surface of the case 19. When the metal ring 31 is inserted in the case 19, it is done so under a certain amount of pressure.

To help this process proceed advantageously, the wall 32 may be provided with a plurality of notches 33 formed at spaced intervals thereover.

In the embodiments described above with reference to FIGS. 9 through 14, soldering or the like may, of course, be additionally employed for mechanical fixing of the cylindrical capacitors 12 and for their electric connection. Further, though not illustrated, besides the instances where the electric connection between the outer electrodes 15 of the cylindrical capacitors 12 and the case 19 is made directly or through the belt or metal ring, there may be an instance where it is made through terminals.

Figure 15:
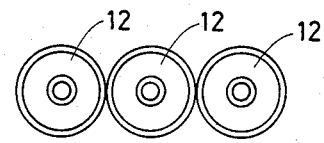
FIG. 15 shows a further embodiment of this invention, illustrating another example of the disposition of cylindrical capacitors.

Referring to FIG. 15, there is shown another example of the disposition of cylindrical capacitors 12. In this example, three cylindrical capacitors 12 are arranged in a line. Stated in connection with the embodiment shown in FIG. 15, the manner in which a plurality of cylindrical capacitors 12 are disposed may be selected in accordance with the disposition of the pins of the connector or the shape of the metal case of the connector. Thus, there may be instances where the cylindrical capacitors are arranged to assume a quadrangular prism or any other form.

Further, as it is applicable to all the embodiments disclosed herein, a plurality of cylindrical capacitors may not be equal in shape or in size. Thus, cylindrical capacitors of different sizes and/or different shapes may be used in combination to form a single noise filter. However, it is preferable from the standpoint of handling that the cylindrical capacitors be the same at least in cross-sectional shape.

Figure 16:
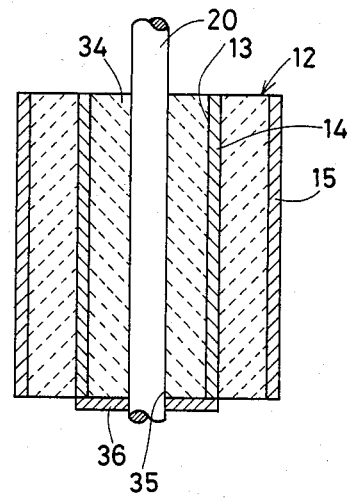
FIG. 16 shows still a further embodiment of this invention, wherein only one cylindrical capacitor contained in an arrangement intended for an LC noise filter is shown in longitudinal section.

Referring to FIG. 16, a cylindrical magnetic body 34 formed, e.g., of ferrite is fitted in the throughgoing hole 13 of a cylindrical capacitor 12. A connection pin 20 is inserted in the throughgoing hole 35 of the cylindrical magnetic body 34. The inner electrode 14 of the cylindrical capacitor 12 is electrically connected to the pin 20 through a terminal plate 36.

According to the embodiment of FIG. 16, an increased inductance component is obtained, so that an LC noise filter can be easily formed. This embodiment can be applied to each of the preceding embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A connector having a built in noise filter, said connector comprising:
   a plurality of cylindrical capacitors each having an inner peripheral surface defining a throughgoing hole, an outer peripheral surface opposed to said inner peripheral surface, an inner electrode formed on said inner peripheral surface and an outer electrode formed on said outer peripheral surface;
   a plurality of connection pins;
   first means external to said capacitors for orienting said connection pins in a desired pattern with said pins being spaced apart and parallel to one another;
   second means for orienting said capacitors so that their throughgoing holes are located in a pattern corresponding to said desired pattern and said pins may be simultaneously inserted into respective ones of said throughgoing holes, each pin being associated with that said capacitor into whose throughgoing hole it extends, said second means mechanically fixing said capacitors to one another such that each said cylindrical capacitor has its outer electrode in electrical and physical contact with at least one adjacent cylindrical capacitor; and third means for electrically connecting each said pin to said inner electrode of its associated capacitor when said pins have been inserted into said throughgoing holes.

2. A noise filter as set forth in claim 1, wherein said plurality of cylindrical capacitors are of the same shape and size.

3. A noise filter as set forth in claim 1, wherein at least one of said plurality of cylindrical capacitors does not have said connection pin extending therethrough.

4. A noise filter as set forth in claim 1, wherein a cylindrical capacitor which does not have said connection pin extending therethrough is replaced by a spacer having the same shape and size as said cylindrical capacitor.

5. A noise filter as set forth in claim 1, wherein said first means includes soldering for connecting the outer electrodes of said cylindrical capacitors to each other.

6. A noise filter as set forth in claim 1, wherein said first means includes an electrically conductive adhesive agent for connecting the outer electrodes of said cylindrical capacitors to each other.

7. A noise filter as set forth in claim 1, wherein said first means includes a hoop-like member surrounding the bunch of said plurality of cylindrical capacitors.

8. A noise filter as set forth in claim 7, wherein said hoop-like member is a metal ring.

9. A noise filter as set forth in claim 7, wherein said hoop-like member is a belt.

10. A noise filter as set forth in claim 7, wherein said hoop-like member is a portion of the case of said connector.

11. A noise filter as set forth in claim 1, further comprising insulating resin which covers said plurality of cylindrical capacitors bunched and having said connection pins extending therethrough.

12. A noise filter as set forth in claim 1, further comprising a cylindrical magnetic body disposed between the inner peripheral surface of said cylindrical capacitor and said connection pin.

13. A noise filter as set forth in claim 1, wherein said second means includes soldering or an electrically conductive adhesive agent.

14. A noise filter as set forth in claim 1, wherein said second means includes a pressure fit between said connection pins and said inner electrodes.

15. A noise filter as set forth in claim 1, wherein said second means includes a spring strip provided on the lateral surface of said connection pin, said spring strip being adapted to contact said inner electrode.

16. A connector according to claim 1, wherein said first means comprises a base plate from which said pin project.

17. The connector of claim 16, further including fourth means for mechanically coupling said base plate to said cylindrical capacitors.

18. The connector of claim 17, wherein said fourth means comprises a cylindrical case.

19. A connector having a noise filter built therein, said connector comprising:

(A) N connection pins, N being an integer greater than 1;

(B) N+1 cylindrical capacitors, each said capacitor including:
  (1) a dielectric cylindrical core having an inner peripheral surface defining a throughgoing hole;
  (2) an outer peripheral surface opposed to said inner peripheral surface; and
  (3) inner and outer electrodes formed on said inner and outer peripheral surface, respectively;

(C) first means for bunching said plurality of cylindrical capacitors mechanically fixing them such that each cylindrical capacitor has its outer electrode in contact with said outer electrode of at least one said capacitor which is adjacent thereto whereby said outer electrodes are electrically connected to one another;

(D) each said connection pin extending through a respective one of said throughgoing holes; and (E) second means for electrically connecting each said pin to that said inner electrode located in said through hole through which said pin extends whereby all but one of said capacitors is electrically coupled to a respective one of said pins.

20. A noise filter used in a connector having a plurality of connection pins, said noise filter comprising:

a plurality of cylindrical capacitors each having an inner peripheral surface defining a throughgoing hole and an outer peripheral surface opposed to said inner peripheral surface, an inner electrode formed on said inner peripheral surface and an outer electrode formed on said inner peripheral surface and an outer electrode formed on said outer peripheral surface;

first means for bunching said plurality of cylindrical capacitors, mechanically fixing them such that each cylindrical capacitor has its outer peripheral surface in contact with said outer peripheral surface of at least one adjacent cylindrical capacitor, and electrically connecting said outer surfaces to each other, said first means including a hoop-like member surrounding said plurality of cylindrical capacitors.

21. A noise filter as set forth in claim 20, wherein said hoop-like member is a metal ring.

22. A noise filter as set forth in claim 20, wherein said hoop-like member is a belt.

23. A noise filter as set forth in claim 20, wherein said hoop-like member is a portion of a case forming part of said connector.

* * * * *